United States Patent [19]

Ehrlich

[11] Patent Number: 5,517,634
[45] Date of Patent: May 14, 1996

[54] DISK DRIVE SYSTEM INCLUDING A DRAM ARRAY AND ASSOCIATED METHOD FOR PROGRAMMING INITIAL INFORMATION INTO THE ARRAY

[75] Inventor: Michael S. Ehrlich, Santa Clara, Calif.

[73] Assignee: Quantum Corporation, Milpitas, Calif.

[21] Appl. No.: 903,001

[22] Filed: Jun. 23, 1992

[51] Int. Cl.⁶ ............................ G06F 13/00; G11C 17/12
[52] U.S. Cl. .................... 395/493; 395/182.04; 395/432; 395/439; 365/95; 365/149; 365/178; 365/200; 365/185.24; 364/DIG. 2; 364/944.2; 364/954.2; 364/952.1; 364/249.2; 364/268.5
[58] Field of Search ............................ 365/95, 149, 178, 365/200, 185.24; 395/425, 275, 700, 821, 431, 432, 438, 439, 427, 182.03, 182.04, 182.05, 183.18, 493; 371/10.2, 10.3

[56] References Cited

U.S. PATENT DOCUMENTS

| | | | |
|---|---|---|---|
| 4,287,571 | 9/1981 | Chakravarti et al. | 365/184 |
| 4,396,996 | 8/1983 | Oldham | 365/95 |
| 4,400,799 | 8/1983 | Gudger | 365/95 |
| 4,418,401 | 11/1983 | Bansal | 365/95 |
| 4,439,843 | 3/1984 | Takamatsu | 365/218 |
| 4,525,810 | 6/1985 | Cochran et al. | 365/184 |
| 4,570,237 | 2/1986 | Nagayoshi et al. | 365/95 |
| 4,584,669 | 4/1986 | Moynihan et al. | 365/95 |
| 4,587,629 | 5/1986 | Dill et al. | 365/218 |
| 4,594,688 | 6/1986 | Uno | 365/95 |
| 4,609,999 | 9/1986 | Rosini | 365/154 |
| 4,730,321 | 3/1988 | Machado | 371/37.5 |
| 4,760,556 | 7/1988 | Deguchi et al. | 365/149 |
| 4,827,448 | 5/1989 | Kuo | 365/149 |
| 5,018,102 | 5/1991 | Houston | 365/95 |
| 5,241,546 | 8/1993 | Peterson et al. | 371/37.1 |
| 5,331,188 | 7/1994 | Acovic et al. | 257/298 |

OTHER PUBLICATIONS

Chung, Ko Hu, "A Model for Hot–Electron–Induced MOSFET Linear–Current Degradation Based on Mobility Reduction Due to Interface–State Generation" *IEEE Trans. on Electron Devices*, vol. 38, No. 6, Jun. 1991, pp. 1362–1370.

*Primary Examiner*—Glenn Gossage
*Attorney, Agent, or Firm*—David B. Harrison

[57] ABSTRACT

An array of dynamic memory cells and method for programming that array with initial information, as well as a disk drive system incorporating such an array, are disclosed. The array includes dynamic memory cells formed on an integrated circuit substrate. The array is modified by a programming step to contain nonvolatile initial information which may be retrieved immediately following a reset sequence. The array includes storage cells arranged as a matrix of bit line columns and row selects, each cell including a pass transistor having a predetermined threshold voltage characteristic Vth and being associated with a storage capacitor. Predetermined ones of the pass transistors are modified by a programming step, either during or following fabrication, so as to have a different predetermined threshold voltage characteristic Vthm, so that the array is comprised of unmodified cells and modified cells in a manner defining nonvolatile initial information in the array. The array is divided into sections, and the initial information is programmed into each of the sections. During a reset sequence, a control circuit applies control voltages to the cells to charge the storage capacitors and selectively discharge the capacitors of either the unmodified cells or the modified cells in a manner which writes the initial information into the array. After the reset sequence, the initial information can be retrieved by reading the array. The array is thereafter available for overwriting of the initial information with other information. The array also includes a section of spare storage cells. A single memory chip implementation of the array is used to store both control firmware and transitory data blocks in a small form-factor rigid disk drive.

3 Claims, 3 Drawing Sheets

DISK DRIVE SYSTEM INCLUDING A DRAM ARRAY AND ASSOCIATED METHOD FOR PROGRAMMING INITIAL INFORMATION INTO THE ARRAY

1. Field of the Invention

The present invention relates to methods for forming an array of dynamic memory cells within an integrated circuit semiconductor chip. More particularly, the present invention relates to methods for forming an array of dynamic random access memory cells to contain nonvolatile programmed information which may be retrieved immediately following a reset sequence; otherwise the cells may be used for storage and retrieval of other information.

2. Background of the Invention

It is known within the art of semiconductor memory array design to implement a memory cell array that powers up to or is resettable to some desired initial state. In this regard, U.S. Pat. Nos. 4,396,996 and 5,018,102 are exemplary. In the prior art, static random access memory ("SRAM") arrays are known in which two cross-coupled inverters are provided as functional replacements for one symmetrically bistable SRAM cell and one read only memory ("ROM") cell. The ROM cell contains one bit of initialization code which is no longer needed and ignored after the initialization process is completed, and the SRAM storage location is subsequently overwritten with newer data.

It is generally understood that ROM is approximately four times as dense as SRAM, meaning that there may be four ROM cells in the space nominally required for a single SRAM cell. Accordingly, when a ROM cell is combined within an SRAM cell to provide a preprogrammed information state at cell initialization, the static bit mask programmable random access memory (SBPRAM) cell results in only about a twenty percent (20%) savings of chip area when compared to a corresponding area of conventional ROM/RAM being replaced. Another way of looking at this small savings is the sum of the area of the SRAM cell plus the area of the ROM cell required functionally to replace the SBPRAM cell is equal to four times the area of the ROM cell (corresponding to the area of the SRAM cell) plus the area of the ROM cell. When reduced, this formula indicates that the SBPRAM cell requires four instead of five single cell areas of ROM, for a saving of only one fifth of a ROM cell for every SBPRAM cell implemented with the prior art approaches.

Thus, a hitherto unsolved need has been for an initially-programmed random access memory array which provides greater savings in areal density than has heretofore been realized, and which may be effectively implemented within a dynamic random access memory (i.e., dynamic RAM or DRAM) cell array.

SUMMARY OF THE INVENTION WITH OBJECTS

One object of the present invention is to provide a minimum area memory cell that functionally replaces one read/write, random access memory ("RAM") cell and one read only memory ("ROM") cell.

Another object of the present invention is to provide a new method for programming and reading a dynamic RAM cell in a manner which enables reading of a prestored initialized data state and subsequently enables dynamic changing of the data state.

Yet another object of the present invention is to use a dynamic RAM memory array within a small electronic appliance, such as a miniature low power hard disk drive as a single external memory element containing a prestored initial data control program for controlling a microcontroller, and thereafter useful for storing dynamically blocks of user data and subsequent microcontroller program instructions.

One more object of the present invention is to provide a method for factory programming a dynamic memory array with initial information in a manner which takes into account the possibility of defective memory cells within the array.

In accordance with principles and aspects of the present invention, an array of dynamic memory cells is formed on an integrated circuit substrate. The array includes storage cells arranged as a matrix of bit line columns and row selects, each cell including a pass transistor having a predetermined threshold voltage characteristic Vth and being associated with a storage capacitor. Predetermined ones of the pass transistors are modified by an additional process step during fabrication so as to have a different predetermined threshold voltage characteristic Vthm, so that the array is comprised of unmodified cells and modified cells in a manner defining nonvolatile initial information in the array. During a reset sequence, a control circuit applies control voltages to the cells to charge (or discharge) the storage capacitors and selectively to discharge (or charge) the capacitors of either the unmodified cells or the modified cells in a manner which writes the initial information into the array. After the reset sequence the initial information can be retrieved by reading the array. The array is thereafter available for overwriting of the initial information with dynamic information.

In one aspect of the invention, the predetermined ones of the pass transistors have been modified by addition of dopant ions implanted by a process of ion implantation.

In another aspect of the invention, the control circuit raises the row selects and the bit lines to a predetermined voltage reference to charge each storage capacitor, then lowers the voltage applied to the row selects to a voltage approximating an average of the threshold voltage characteristics Vth and Vthm of the pass transistors and subsequently lowers the bit lines to a zero voltage reference level to discharge selected storage capacitors, thereby writing the array with the initial information.

In a further aspect of the invention, the array is divided into two sections and the initial information is defined in each of two sections. In this aspect, a third area of extra data cells may be provided e.g. as spares for defective cells in the first or second areas.

In another facet of the invention, a method is defined for operating an array of dynamic memory cells formed on an integrated circuit substrate, the array including storage cells arranged as a matrix of bit line columns and row selects, each cell including a pass transistor having a predetermined threshold voltage characteristic Vth and being associated with a storage capacitor, predetermined ones of the pass transistors being modified by an additional process step during fabrication so as to have a different predetermined threshold voltage characteristic Vthm so that the array is comprised of unmodified cells and modified cells in a manner defining nonvolatile initial information, and a control circuit for applying control voltages to the bit lines and row selects during a reset sequence comprising the steps of:

raising the row selects and the bit lines to a predetermined voltage reference at a first time, then lowering all row selects to a voltage approximating an average of the threshold voltage characteristics Vth and Vthm of the pass transistors, then lowering the bit lines to a zero voltage reference level, and then lowering all row selects to a zero voltage reference level, whereby the storage capacitors are initially charged and then selectively discharged thereby writing the array with the initial information.

As one exemplary application, the dynamic memory array of the present invention is employed within a miniature disk drive subsystem including a rotating data storage disk, writing and reading circuitry for writing data to and for reading data from the rotating data storage disk, an interface circuit for connecting the disk drive subsystem to a host system, and control circuitry for controlling the disk drive, the control circuitry including a programmed microcontroller means, and a single external memory chip including the array of dynamic memory cells in accordance with the present invention. The initial information can thereupon be retrieved by the microcontroller and executed as program instructions, the array thereafter being available to the disk drive subsystem for dynamic overwriting of the initial information with later information.

These and other objects, advantages, aspects and features of the present invention will be more fully understood and appreciated upon consideration of the following detailed description of a preferred embodiment, presented in conjunction with the accompanying drawings.

DETAILED DESCRIPTION OF A PREFERRED EMBODIMENT

Figure 1:
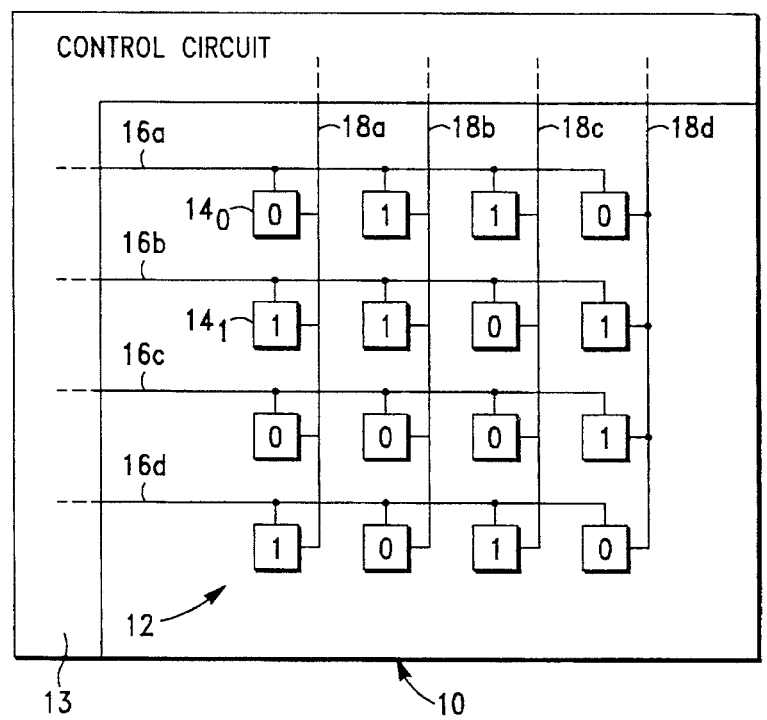
FIG. 1 is a diagrammatic plan view of a metal oxide semiconductor (MOS) integrated circuit dynamic memory chip fabricated in accordance with principles and aspects of the present invention, illustrating an initial information matrix of "1"s and "0"s programmed during the fabrication of the chip.

As shown in FIG. 1, an integrated circuit memory chip 10 includes a dynamic memory array 12 comprising a number of memory cells 14 arranged in a column and row matrix. A control circuit 13 applies control voltages to the columns and rows in order to provide dynamic refresh of the cells 14 in conventional fashion, and also to carry out a reset sequence to write the array with initial information as described in greater detail hereinafter.

Figure 2:
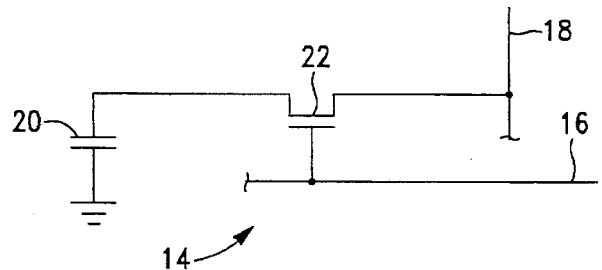
FIG. 2 is an electrical circuit schematic of a memory cell of the FIG. 1 memory chip.

The columns of the array 12 comprise bit lines 18, and the rows thereof comprise row select lines 16. Each cell 14 of a one transistor (1T) cell array includes e.g. an N-channel enhancement mode pass transistor 22 operating in conjunction with a data storage capacitor 20, as shown in FIG. 2. The bit lines 18 are connected by the pass transistor 22 to the capacitor 20, whereas the row select lines 16 control the respective gates of the pass transistors, thereby determining whether they are "on" (conducting) or "off" (nonconducting).

When the cell 14 is set to a data "zero" condition, the storage capacitor 20 is discharged. When the cell 14 is set to a data "one" condition, the storage capacitor 20 is charged to some predetermined voltage level, such as a level approaching the supply voltage Vdd minus a threshold voltage Vth of the pass transistor 22. Because of internal leakage paths present within the semiconductor chip structure 10, when the storage capacitor 20 is charged, a periodic refresh operation must be employed to add charge to the capacitor 20 which is otherwise lost over the internal leakage paths. Periodic refresh is conventionally applied to dynamic random access memory ("DRAM") arrays, such as the array 12 of FIG. 1.

Figure 3:
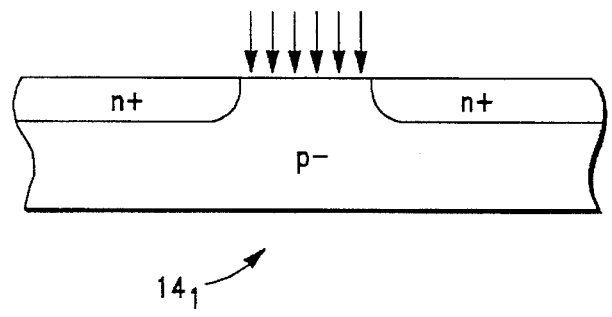
FIG. 3 is a greatly enlarged cross sectional diagram of a partially fabricated n-type pass transistor of the FIG. 2 memory cell.

In accordance with principles of the present invention, the DRAM array 12 is modified during fabrication, as by providing an additional threshold adjustment on the pass transistors of selected 1T cells, identified in FIG. 1 by the reference numeral $14_1$. While this selective threshold adjustment may be performed in a number of ways, one preferred method is by an additional channel ion implant fabrication step, as illustrated in FIG. 3. Another method is to change the threshold with charge carriers in the insulating layer induced e.g. by an electron beam late in the fabrication process. See, e.g. U.S. Pat. No. 4,396,996 for example, the disclosure of which is hereby incorporated herein by reference.

Figure 2A:
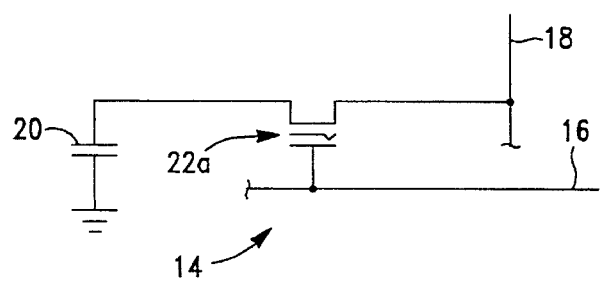
FIG. 2a is an electrical circuit schematic of another version of a memory cell of the FIG. 1 memory chip, showing a floating gate transistor.

Still one other method to change the threshold characteristic of the pass transitor 22 is to apply an increased (or not decreased) supply voltage to create high energy ("hot") electrons in a region having a high strength vertical electrical field, such as within the dielectric material over the channel of the pass transistor or through a "floating gate" structure, as illustrated in FIG. 2a, within the oxide dielectric insulator over the transistor's channel. In practice, the hot electrons are added to the gate insulating layer (or floating gate structure as separated by a very thin oxide layer promoting transfer of "hot electrons" of the pass transistor during a "program after fabrication" operation. Examples of "floating gate" metal oxide semiconductor field effect transistor (MOSFET) devices are given in U.S. Pat. Nos. 4,400, 799 and 4,609,999, the disclosures of which, are hereby incorporated herein by reference.

Because the time duration of the electrical current providing the hot electrons to the gate insulating layer (or "floating gate") is limited by the relatively small cell capacitance, it is necessary to perform numerous programming iterations (e.g., thousands depending upon the cell characteristics). A refresh of the entire array is required prior to each subsequent programming iteration, until programming is completed, and the threshold is effectively changed, thereby imparting the desired initial information state for the array of cells.

After the special process step is completed, the pass transistors $14_1$ will have a threshold voltage Vthm which is equal to a first voltage level V1. Pass transistors $14_0$ which are not subjected to the additional process step will have a threshold voltage Vth which is equal to a second voltage level V2, (where e.g. V1 is greater than V2).

The additional process step could increase or decrease the nominal threshold characteristic of the selected pass transistor in a predetermined known fashion, and the same functional results will be obtained.

For example, pass transistors in cells $14_1$ which are programmed to record a logic "1" (meaning that a high voltage level is stored across the cell's storage capacitor after a reset sequence) will have a threshold voltage equal to V1. The higher threshold voltage V1 (higher as compared with the threshold voltage V2 of the other cells $14_0$ string a logic "0" state following the reset sequence) will inhibit the pass transistor 22 from turning on and discharging its storage capacitor 20 when the array 12 is conditionally discharged near the end of the reset sequence. In contrast, all pass transistors in cells $14_0$ corresponding to a logic "0" (meaning that a low voltage level is stored across the cell's storage capacitor 20 following the reset sequence) in the desired initial state will have their thresholds set to a lower threshold voltage V2. This lower threshold will thus enable the pass transistor 22 to conduct and discharge its storage capacitor 20 when the array 12 is conditionally discharged at the end of the reset sequence.

Figure 4:
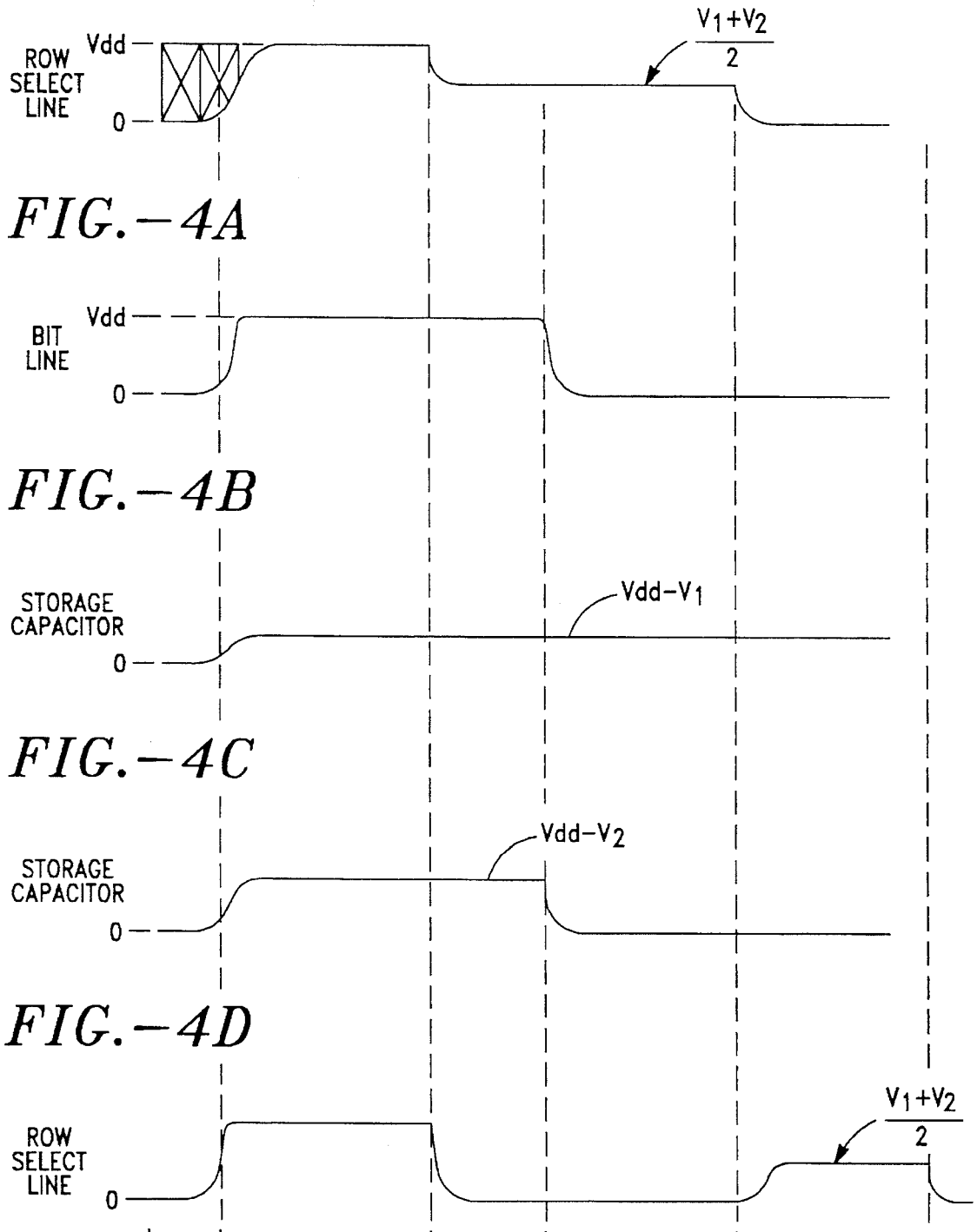
FIG. 4 illustrates a set of waveforms corresponding to one preferred reset algorithm for carrying out a reset sequence for recovering the initial information prestored in the FIG. 1 memory array.

FIG. 4 sets forth an exemplary reset sequence for restoring nonvolatile information programmed in a DRAM chip in accordance with the present invention. In overview, a charge is placed across every cell's storage capacitor 20 drawn from a supply Vdd. The voltage across the capacitor 20 will be equal to the power supply minus either V1 (graph C of FIG. 4) or V2 (graph D of FIG. 4), depending upon whether the cell has had its threshold characteristic programmed (i.e., changed). The capacitors holding a charge of power supply minus V2 are then discharged to a low voltage level as shown in graph D at time t3, leaving the array 12 with an initial information matrix of 1 s and 0s which may then be read out and used as information, such as control programs, diagnostics, applications programs, or user data, by other circuitry, such as a control program for the low power, high capacity and performance disk drive 100 illustrated hereafter in FIG. 6.

The following steps are illustrative of the progressive logical states graphed in FIG. 4:

1. At time t1 raise to the positive voltage rail Vdd, all row selects (graph A of FIG. 4) and all bit lines (graph B of FIG. 4) of the N-channel MOS one transistor (1T) dynamic memory array 12. All storage capacitors of the array should now be charged either to Vdd-V1 (graph C of FIG. 4) or Vdd-V2 (graph D of FIG. 4).

2. At a time t2, lower all row selects to an average of V1 and V2 (i.e. (V1+V2)/2) (graph A) while maintaining the bit lines high (graph B).

3. After row selects have settled to the average value, at time t3 lower all bitlines to zero potential (ground) and hold them approximately at that level. All pass transistors 22 whose threshold voltage level equals V2 will conduct and will discharge their storage capacitors, leaving those cells with a logical "0" condition (graph D at time t3). All pass transistors 22 whose threshold voltage level equals V1 (which is now greater than the voltage on the row selects) will not conduct (graph C at time t3), and their capacitors 20 remain charged to a logical "1" condition.

4. After waiting long enough for all of the V2 threshold cells to discharge, lower all row selects to zero potential (graph A at time t4) and resume normal operation of the array, with the initial information matrix now stored within the array.

After time t4 the memory array 12 may now be read and the initial information matrix accessed and retrieved in the conventional manner.

Alternatively, and with reference to graph E of FIG. 4, the row select lines are raised to Vdd at time t1 and are then lowered to ground potential at time t2. The row select lines 16 are held at ground potential until time t4 when they are raised to the average voltage (V1+V2)/2. Since the step of causing all of the row selects to approach this precise average voltage causes the largest delay tolerance variation from chip to chip, making this delay the next to last step of the reset sequence results in a scheme lending itself well to parts binning (i.e. different speed parts are able to use the same overall reset sequence design). At a time t5, all of the row select lines 16 are again lowered to ground and normal operation is then resumed. Only the final action timing (at t5) changes from part to part.

As an example of a programming sequence employed with hot electron transfer to the channel dielectric or to a floating gate structure within the channel of the pass transistor 22, a programming sequence includes the steps of:

1. Refresh all rows of the array in accordance with conventional DRAM refresh techniques.

2. Force charges trapped in the gate oxide over the channel out by making row select very low (i.e. substantially negative with respect to ground).

3. Repeat steps 1 and 2 over n cycles, where n is a number sufficient to erase any residual charge from the dielectric layer or from the floating gate structures of all cells.

4. Refresh all rows, and end with row selects and bit lines at zero potential.

5. Raise all bit lines to a very high potential above Vdd.

6. Raise all row selects to Vdd-Vo, where Vo is a voltage difference between a logic one state and a logic zero state at this step in the programming sequence.

7. Lower all bit lines and row selects to zero potential.

8. Refresh all cells, differentiating between Vdd-Vth-Vo and Vdd-Vth across the storage capacitors 20, thereby leaving the capacitors with either a charge of Vdd-Vth or with a zero voltage, thereby establishing the predetermined initial information matrix.

9. Repeat steps 5–8 until the thresholds of the selected cells are changed.

At readout of the initial information programmed in this manner, it may be necessary to invert the data. In order to determine whether inversion is necessary or not, one logical cell of the array is a dedicated cell ("invert bit"), and its logical value is exclusively-ORed with the data stream coming into and leaving the memory array so long as the invert bit is set, thereby handling memory data inversion in a known and controlled way.

As shown in the FIG. 1 example, the initial information matrix is:

| 0 | 1 | 1 | 0 |
| --- | --- | --- | --- |
| 1 | 1 | 0 | 1 |
| 0 | 0 | 0 | 1 |
| 1 | 0 | 1 | 0 |

Because positive charging of a cell with Vth-V1 will result in a smaller charge across the storage capacitor 20 of the cells $14_1$ initially programmed to a logical "1" level than in a comparable conventional DRAM cell, the maximum interval between refresh cycles will be shorter than for such conventional DRAM. Access times for the dynamic BPRAM array 12 will also be adversely affected by the smaller stored charge across the V1 cell $14_1$ capacitors. It is therefore desirable to keep the thresholds V1 and V2 as close as possible to the optimum threshold Vth while still accounting for alternating current (AC) and direct current (DC) electrical and DC electrical and process noise.

From the foregoing explanation, the dynamic BPRAM array 12 in accordance with the present invention differs from static bit programmable random access memory arrays in that in those arrays the storage cell logical state is decided on the basis of a comparison of threshold voltages of two transistors within the cell, whereas in the dynamic BPRAM array 12, the logical state of the cell is decided by a comparison of the threshold voltage of a single pass transistor in relation to an externally generated reference voltage, e.g. (Vth −Vthm)/2. Also, the storage cells 14 of the dynamic BPRAM array 12 could be implemented with P-channel MOS pass transistors 22, or the capacitors 20 could be returned to the positive voltage rail Vdd, rather than ground. In this latter approach, during the reset sequence, the capacitors would be initially discharged and then selectively charged in accordance with the initial information matrix programming of the array 12.

Column or row redundancy is often used in conventional high capacity DRAM circuit chips to improve product yields. The basic idea behind such redundancy is to access an "extra" column or row of the matrix array in place of a defective column or row thereof. Usually, provision of only a few extra columns or rows is sufficient to raise product yields to a commercially acceptable level. Since addresses of defective columns or rows are unknown during fabrication, it is impossible to know how to mask program the extra columns or rows during fabrication in order to impart the initial information matrix. However, applicant has discovered that there are solutions to this problem.

Figure 5:
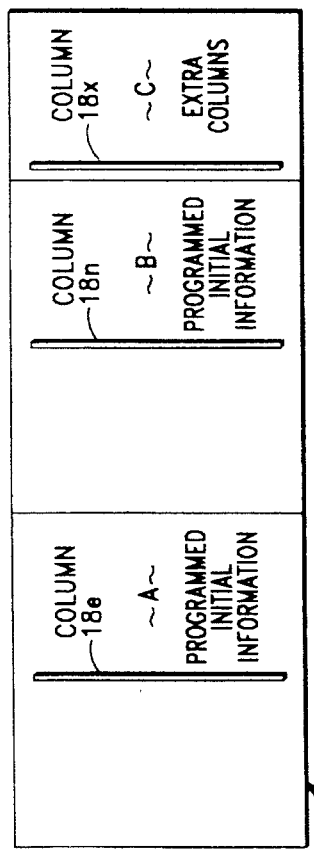
FIG. 5 is an illustration of address space within a memory array illustration of the present invention.

As shown in FIG. 5, one solution lies in using only one half of the available RAM space of the matrix array 12 for the initial information matrix. The array is divided into two halves, a half A, and a half B. Each half is factory "mask" programmed with the initial information matrix. Upon detection of a defective cell, e.g. a cell 14 in the column 18e in the first half A, the corresponding column 18n of the second half B is accessed in place thereof. This approach is illustrated in FIG. 5, and it results in a 33% savings of integrated circuit chip area as compared with the previously described RAM/ROM implementation. This replacement scheme applies to both static and dynamic BPRAM, such as the array 12. A third area C is provided for extra available spare columns/rows, in order to improve process yields during fabrication. In the example given in FIG. 5, when accesses to the defective column 18e are vectored (i.e., redirected or mapped) to column 18n, any attempt to directly address column 18n in area B will be vectored to column 18x in area C. If there is no defect in column 18e, but there is a defect in column 18n in area B, an access to column 18e in area A remains unvectored; however, an access to column 18n in area B is vectored to column 18x in area C, for example.

Another solution involves interleaving the initial information matrix into block interleaves distributed across the memory array and appending error correction code (ECC) syndrome remainders to the interleaves. Hardware communicating with the BPRAM memory array within a system may then be invoked to locate and correct any data errors resulting from vectoring to unprogrammed spare cell locations replacing defective programmed cells. An example of a satisfactory ECC implementation that may be adapted for use in the present context is given in commonly assigned U.S. Pat. No. 4,730,321 as improved by the teachings of U.S. Pat. Application Ser. No. 07/650,791 filed on Feb. 1, 1991, now U.S. Pat. No. 5,241,546, the disclosures thereof being hereby incorporated by reference into this patent. Thus this latter solution obviates the need to mask program the spare rows or columns of a preprogrammed BPRAM memory array, notwithstanding the presence of defects in the programmed region.

Figure 6:
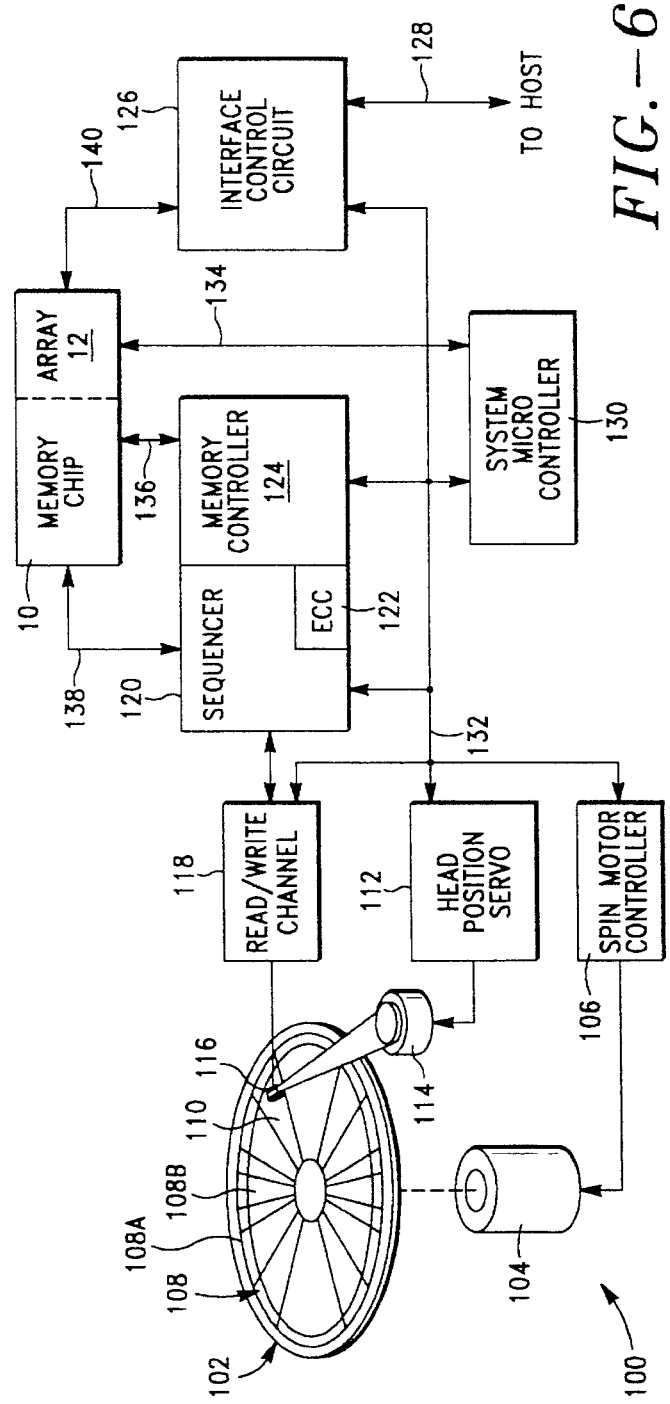
FIG. 6 is a simplified block diagram of a low power high capacity fixed disk drive including a single dynamic memory array of the present invention for both user data blocks and program instructions for a microcontroller thereof.

This approach may be more fully understood and appreciated by reference to FIG. 6. Therein, a miniature, very low power hard disk drive subsystem 100 is disclosed. The subsystem 100 includes a data storage disk 102 which is rotated by a spindle motor 104 at a predetermined angular velocity under the control of a spin motor controller 106. The disk 102 includes a multiplicity of concentric data tracks 108. A few tracks 108A contain system software and control information, and many more tracks 108B contain user data storage. A series of embedded servo sectors 110 extend radially across the disk 102 and provide head position servo information used by a head position servo loop 112 to position a rotary voice coil actuator 114. The rotary voice coil actuator positions a data transducer head 116 (i.e., a read/write head) which reads the control, user and servo data, and which writes user data in appropriate locations on the surface of the disk 102.

The subsystem 100 further includes a read/write channel 118, a data sequencer 120 which includes an ECC unit 122 and a memory controller 124 for controlling the memory chip 10 including the array 12 of the present invention. An interface control circuit 126 implements a system interface, such as an "AT" interface or other suitable bus-level interface, which extends over a path 128 to a host computing system. In this example the memory array 12 may be a separate chip, or it may be an area of a larger ASIC device, for example.

A system microcontroller 130 includes a control path 132 leading to the spin motor controller 106, the head position servo 112, the read/write channel 118, the sequencer 120 and memory controller 124 and to the interface control circuit 126. In addition, a direct memory access channel 134 from the microcontroller 130 to the memory chip 10 is provided for obtaining the initial information matrix as e.g. an initial control program, for enabling downloading of further control programs from the disk tracks 108A, for example.

The microcontroller 130 may alternatively employ a channel through the memory controller 124 which includes an address control path 136 for directly addressing the memory chip 10 and which provides direct access to the error correction code hardware 122 in order to correct any control data that may need locating and correcting. A data path 138 extends between the memory chip 10 and the sequencer 120, and a similar data path 140 extends between the memory chip 10 and the interface control circuit 126.

Thus, it is seen that the disk drive subsystem 100 makes use of a single dynamic memory chip 10 in a manner in which the initial information matrix of the array 12 may be stored and used by the microcontroller 130 as control firmware, and further in which user data blocks coming from and going to the data storage disk 102 may be temporarily stored. This single memory chip implementation with dynamic BPRAM in accordance with the present invention results in a practical, very low cost disk drive implementation and reduces the number of chips, and reduces power consumption, required for implementing very small, rigid disk drives.

The initial information matrix stored in the array 12 may be control programming for the microcontroller 130 enabling powered down or "sleep mode" operation of the disk drive subsystem 100, in order to reduce overall subsystem power consumption, when the computing system and drive subsystem 100 are used in e.g. a battery powered environment. Also, the initial information matrix may be arranged as an arrangement of pages of initial information, wherein each page is selectively reset and then accessed by the microcontroller 130. Alternatively, the microcontroller 130 may be "put to sleep" and a programmable state machine within the interface control circuit 126 will use its direct data access channel to the array 12 in order to use the initial information to handle control and data transactions with the host system during powered down or "sleep mode".

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A dynamic memory formed on an integrated circuit substrate, the dynamic memory comprising (i) an array including storage cells arranged as a matrix and electrically interconnected by bit lines and row select lines, each cell including a pass transistor means having a predetermined threshold voltage characteristic $V_{th}$ and being associated with a storage capacitor, predetermined ones of the pass transistor means being modified by a programming step so as to have a different predetermined threshold voltage characteristic $V_{thm}$, so that said array is comprised of a set of unmodified cells and a set of modified cells in a manner defining nonvolatile initial information in said array; and (ii) array control means applying control voltages to said cells during a reset sequence to charge all of the storage capacitors and to selectively discharge the storage capacitors in a manner which writes the initial information into the array, whereby the initial information can thereupon be retrieved by reading the array, the array thereafter being available for overwriting of the initial information with other information, wherein the array is divided into two sections and wherein the initial information is programmed in each of said two sections, and the array further comprises a third section of spare storage cells.

2. A miniature disk drive subsystem including a rotating data storage disk, a positionable read/write head for writing data to and for reading data from the rotating data storage disk, interface means for connecting the disk drive subsystem to a host system, data path means interconnecting the read/write head and the interface memos, and control means for controlling the data path means to coordinate data transfers between the read/write head and the interface means, the control memos comprising a microcontroller and an external dynamic memory chip connected to the microcontroller, the dynamic memory chip comprising (i) an array including storage cells arranged as a matrix and electrically interconnected by bit lines and row select lines, each cell including a pass transistor means having a predetermined threshold voltage characteristic $V_{th}$ and being associated with a storage capacitor, predetermined ones of the pass transistor means being modified by a programming step so as to have a different predetermined threshold characteristic $V_{thm}$ so that said array is comprised of a set of unmodified cells and a set of modified cells in a manner defining nonvolatile initial information in said array; and (ii) array control means for applying control voltages to said cells during a reset sequence to charge all of the storage capacitors and to selectively discharge the storage capacitors in a manner which writes the initial information into the array, whereby the initial information can thereupon be retrieved by the microcontroller and executed as program instructions, the array thereafter being available for overwriting of the initial information with other information, wherein the array is divided into two sections and wherein the initial information is programmed in each of said two sections, and the array further comprises a third section of spare storage cells.

3. A programmable dynamic memory formed on an integrated circuit substrate, the programmable dynamic memory comprising (i) an array including storage cells arranged as a matrix and electrically interconnected by bit lines and row select lines, each cell including a pass transistor means having a predetermined threshold voltage characteristic Vth and being associated with a storage capacitor, each pass transistor means including floating gate means for modifying that transistor means' predetermined threshold voltage characteristic, predetermined ones of the pass transistor means being modified by a programming step so as to have a different predetermined threshold voltage characteristic $V_{thm}$, so that said array is comprised of a set of modified cells and a set of modified cells in a manner defining nonvolatile initial information in said array; and (ii) array control means for applying control voltages to said cells during a reset sequence to charge all of the storage capacitors and to selectively discharge the storage capacitors in a manner which writes the initial information into the array, whereby the initial information can thereupon be retrieved by reading the array, the array thereafter being available for overwriting of the initial information with other information, wherein the array is divided into two sections and wherein the initial information is programmed in each of said two sections, and the array further comprises a third section of spare storage cells.

* * * * *

UNITED STATES PATENT AND TRADEMARK OFFICE
CERTIFICATE OF CORRECTION

PATENT NO. : 5,517,634
DATED : May 14, 1996
INVENTOR(S) : Michael S. Ehrlich

It is certified that error appears in the above-indentified patent and that said Letters Patent is hereby corrected as shown below:

Column 10, claim 3, line 39, "modified" should read --unmodified--

Signed and Sealed this

Thirtieth Day of July, 1996

Attest:

BRUCE LEHMAN

*Attesting Officer*   *Commissioner of Patents and Trademarks*